United States Patent [19]

Edahiro et al.

[11] 4,406,680
[45] Sep. 27, 1983

[54] PROCESS FOR PRODUCING HIGH-PURITY SILICA GLASS

[75] Inventors: Takao Edahiro, Mito; Gotaro Tanaka, Kanagawa; Toru Kuwahara, Kanagawa; Masaaki Yoshida, Kanagawa, all of Japan

[73] Assignees: Nippon Telegraph & Telephone Public Corporation, Tokyo; Sumitomo Electric Industries, Ltd., Osaka, both of Japan

[21] Appl. No.: 344,583

[22] Filed: Feb. 1, 1982

Related U.S. Application Data

[63] Continuation of Ser. No. 163,139, Jun. 26, 1980, abandoned.

[30] Foreign Application Priority Data

Jun. 26, 1979 [JP] Japan ............................. 54-81139

[51] Int. Cl.³ ...................... C03B 19/06; C03B 20/00
[52] U.S. Cl. ..................................... 65/18.2; 65/3.12; 65/32
[58] Field of Search ................... 65/18.2, 3.12, 13, 32; 427/163

[56] References Cited

U.S. PATENT DOCUMENTS

| | | | |
|---|---|---|---|
| 3,459,522 | 8/1969 | Elmer et al. | 65/30.1 |
| 3,933,454 | 1/1976 | De Luca | 65/30.1 X |
| 4,038,370 | 7/1977 | Tokimoto et al. | 423/336 |
| 4,099,835 | 7/1978 | French et al. | 65/3.12 X |
| 4,161,505 | 7/1979 | Shiraishi et al. | 427/163 X |
| 4,224,046 | 9/1980 | Izawa et al. | 65/3.12 |

Primary Examiner—Richard V. Fisher
Attorney, Agent, or Firm—Sughrue, Mion, Zinn, Macpeak & Seas

[57] ABSTRACT

A process for producing high-purity silica glass wherein glass-forming chlorides, hydrogen gas, oxygen and an inert gas are supplied from a glass burner, the chlorides are decomposed by flame oxidation to form fine grains of glass which are deposited on a starting member and the glass deposit is sintered to provide a transparent vitreous substance, the volume ratio of oxygen gas to the sum of the chlorides and hydrogen gas being greater than about 0.6, preferably greater than about 1.0, and less than about 20.

3 Claims, 2 Drawing Figures

4,406,680

PROCESS FOR PRODUCING HIGH-PURITY SILICA GLASS

This a continuation of application Ser. No. 163,139, filed June 26, 1980, now abandoned.

BACKGROUND OF THE INVENTION

1. Field of the Invention:

This invention relates to a process for producing a high purity fused quartz glass with a low moisture content.

2. Description of the Prior Art:

A typical method of making fused quartz glass of a grade suitable for use as low-loss optical fibers is the chemical vapor-phase process wherein fine grains of glass (hereunder referred to as soot) generated by the use of an oxygen/hydrogen burner are deposited on a starting member. This method is more productive than other conventional methods, for example, the "internal sooting process" wherein a glass tube provided with reaction heat from an external source is supplied with gases carrying a material for glass which forms a soot that is deposited on the internal wall of the glass tube. These methods are discussed in commonly assigned U.S. Pat. No. 4,224,046. Even glasses made by chemical vapor-phase process are subject to light loss due to the presence of OH groups generally in an amount of about 20 to 50 ppm. Thus, various efforts have been made to decrease the OH group content in glasses adapted for use in low-loss optical fibers.

According to one of these methods, the soot generated by chemical vapor-phase process is deposited in a desired form and the deposit is sintered in a chlorine content atmosphere to form a vitreous substance. This method, however, is not advantageous since it is very difficult to sufficiently diffuse and penetrate chlorine into the inner portion of the glass and, in order to reduce the residual OH group content to a minimum extent, the treatment with chlorine must be conducted for a prolonged period of time. Further, a transition metal, particularly an iron (II) compound, contaminates the deposit as a result of the treatment with chlorine.

Other proposals for reducing the content of OH groups in silica glass are described in Japanese Patent Publications Nos. 42047/78 dated Nov. 8, 1978 (corresponding to U.S. Pat. No. 4,038,370) and 42335/78 dated Nov. 10, 1978. In these methods, a silane-containing gas is first oxidatively decomposed in an excess of hydrogen gas to provide a vitreous substance containing a bond having an oxygen defect. Thereafter, the vitreous substance is heat-treated such that the OH groups present between the glass molecules act on the oxygen-defect site so as to remove the OH groups as hydrogen gas. However, even these methods are unable to achieve complete removal of the OH groups because the reaction is carried out in the presence of an excess of hydrogen gas and the resulting glass contains much water (OH groups).

SUMMARY OF THE INVENTION

The primary purpose of this invention is to provide an efficient process for producing a high purity silica glass with a reduced OH content.

This invention provides a process for making a transparent vitreous substance wherein the glass-forming chlorides, hydrogen gas, oxygen gas and an inert gas are supplied from a burner to decompose the chlorides by flame oxidation and form a deposit of soot on a starting member and the deposit is then sintered. A characteristic feature of the process is that the volume ratio of oxygen gas to the sum of the chloride and hydrogen gas is greater than about 0.6, preferably greater than 1.0, and less than about 20. At the volume ratio less than about 0.6, an effective reduction of OH content cannot be achieved and at the volume ratio higher than about 20, the temperature of the flame tends to lower.

The process of this invention differs greatly from the conventional process in two regards: (1) Since the reaction is performed using glass-forming chlorides in an excess of oxygen, a specific dehydrating step is not required; (2) The content of remaining OH groups can be reduced by generating chlorine gas in the course of the soot formation, depositing the chlorine gas on fine particles of glass and effectively utilizing the deposited chlorine during the sintering process.

BRIEF DESCRIPTION OF THE DRAWINGS

The process of this invention is now described in detail by reference to the accompanying drawings, in which.

DETAILED DESCRIPTION OF THE INVENTION

As described above, according to this invention, chlorides used as the glass-forming material are decomposed by flame oxidation wherein the chlorides, oxygen gas, argon gas and hydrogen gas are supplied from a glass burner comprising a plurality of coaxial cylinders. Preferably, the chlorides are supplied through the innermost cylinder of the burner, oxygen through the cylinder next to the innermost, argon through the cylinder second to the innermost, and hydrogen through the cylinder third to the innermost, and with the volume ratio of oxygen gas to the sum of hydrogen and the chloride being within a specified value. By sintering the resulting soot under conventional conditions, an appreciable reduction in the OH content of the glass product is achieved. As a further advantage, there is no need to supply a variety of chlorides as a source of chlorine atmosphere for the sintering operation, as used in the conventional process, for example, U.S. Pat. No. 3,933,454 and Japanese Patent Publication No. 23036/67 (corresponding to U.S. Pat. No. 3,459,522), and high purity silica glass or a doped glass having low OH content can be produced easily without increasing the content of impurities such as a transition metal. Therefore, the process of this invention is expected to be a great contribution to the development of optical transmission technology.

Figure 1:
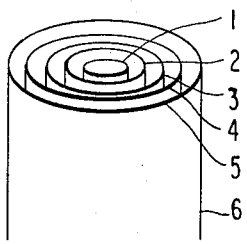
FIG. 1 is a perspective view of a burner composed of five coaxial cylinders for use in one embodiment of the process of this invention, wherein the burner is indicated as 6 and individual gas channels are indicated by 1 to 5.
Figure 2:
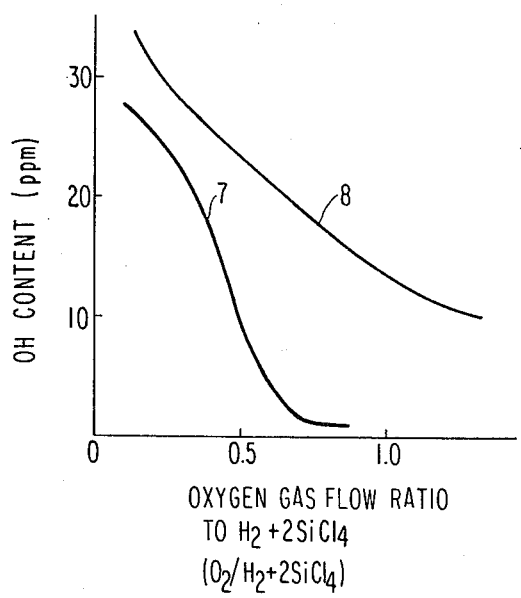
FIG. 2 is a graph showing the OH content of the glass produced according to one embodiment of this invention, wherein curve 7 plots the change in the OH content that resulted from the change in the value of $O_2/(H_2+2SiCl_4)$ with $SiCl_4$ carried on argon, oxygen gas, argon gas and hydrogen gas being supplied through channels 1 to 4, respectively, and curve 8 plots the same parameter with $SiCl_4$ carried on argon, hydrogen gas, argon gas and oxygen gas being supplied through the channels 1 to 4, respectively.

The curves in FIG. 2 show that in the process of this invention, hydrogen gas supplied from the glass burner 6 has a great effect on the concentration of residual OH groups in the glass with respect to the position of hydrogen relative to other gases supplied and the value of $O_2/(H_2+2SiCl_4)$.

Table 1 shows the correlation between the $Cl_2$ content (in relative values) in the glass and the OH content. It is clear from Table 1 that the glass having high $Cl_2$ content has low OH content.

TABLE 1

| OH content (ppm) | 1 | 15 | 20 |
|---|---|---|---|
| $Cl_2$ content (relative value) | 150–200 | about 90 | about 70 |

To be more specific, in the case of curve 7, $SiCl_4$ reacts with $O_2$ at the mouth of the burner and forms $SiO_2$ and $Cl_2$ as indicated by the following reaction scheme:

$$SiCl_4 + O_2 \rightarrow SiO_2 + 2Cl_2 \qquad (1)$$

to form a deposit of soot on the starting member in which $Cl_2$ is adsorbed on the surface of $SiO_2$. The reaction heat is generated by $H_2$ and $O_2$ as follows:

$$2H_2 + O_2 \rightarrow 2H_2O \qquad (2)$$

In the case of curve 8, since $SiCl_4$ and $O_2$ are not supplied in adjacent streams, reaction (1) is less likely to occur. Instead, $H_2O$ formed in reaction (2) primarily reacts with $SiCl_4$ to form soot according to the reaction scheme shown below:

$$SiCl_2 + 2H_2O \rightarrow SiO_2 + 4HCl \qquad (3)$$

Though minor in comparison to reaction (3), reaction (1) does take place and the resulting $Cl_2$ is adsorbed on the soot to thereby reduce the OH content, but to a smaller degree than in the case of curve 7 because only a small amount of $Cl_2$ is produced.

In the process of this invention, regardless of the order of the gases supplied to the glass burner, the following three reactions occurs when $SiCl_4$ is used as an example of glass-forming chlorides.

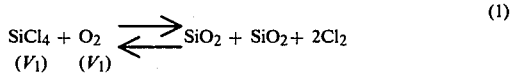
(1)

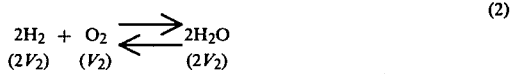
(2)

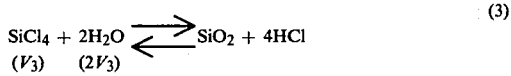
(3)

wherein $V_1$, $V_2$ and $V_3$ represent supplied volumes of the corresponding materials. Assuming that the reaction proceeds stoichiometrically, since $H_2O$ in the equation (3) is supplied from the equation (2), the volume ratio of $V_3$ to $V_2$ can be represented by the following equation $$2V_3 < 2V_2 \qquad (4)$$

On the other hand, when the ratio $O_2/H_2+2SiCl_4$ is represented by "k", $$k = \frac{V_1 + V_2}{2V_1 + 2V_2 + 2V_3} = 0.5 - \frac{V_3}{2(V_1 + V_2 + V_3)}.$$

That is, the value of "k" is less than 0.5 when the reaction proceeds stoichiometrically.

In the case of curve 7, the reactions represented by the equations (1) and (2) occur mainly relative to the reaction represented by the equation (3) and, therefore $V_3$ becomes smaller. When the reaction proceeds stoichiometrically, "k" is approximately 0.5.

On the other hand, in the case of curve 8, the reactions represented by the equations (2) and (3) occur mainly relative to the reaction represented by the equation (1) and, therefore, $V_3$ is approximately equal to $V_2$. When the reaction proceeds stoichiometrically, "k" becomes smaller than about 0.5.

The foregoing description assumes that the chlorides as the glass-forming material, oxygen gas, inert gas and hydrogen gas are supplied from a burner, with the chlorides supplied through the innermost coaxial cylinder of the burner and hydrogen through the cylinder third from the innermost. It will be understood, however, that to provide a stable flame, it may be desirable to supply another gas such as oxygen, argon, nitrogen and the like through the outermost coaxial cylinder (surrounding the cylinder through which hydrogen is supplied) without compromising the intended object of this invention.

The glass-forming chlorides which can be used in the present invention are $SiCl_4$, $SiHCl_3$, $BCl_3$, $GeCl_4$, $PCl_3$, $POCl_3$, $PCl_5$ or a mixture thereof, preferably $SiCl_4$ or a mixture containing $SiCl_4$.

This invention is now described in greater detail by reference to the following examples which are given here for illustrative purposes only and are by no means intended to limit the scope of the present invention.

EXAMPLE 1

A burner comprising four coaxial cylinders and whose outside diameter was about 20 mm was supplied with $SiCl_4$(0.1 liter/min)+$GeCl_4$ (0.03 liters/min) carried on argon, oxygen gas (2.5 liters/min), argon gas (1.3 liters/min) and hydrogen gas (3.5 liters/min), with $SiCl_4$+$GeCl_4$ supplied through the innermost cylinder, oxygen gas through the cylinder next to the innermost, argon gas through the cylinder second from the innermost and hydrogen gas through the outermost cylinder. Decomposition of the chlorides by flame oxidation formed a soot which was deposited on the tip of a rotating seed rod at a growth rate of 4 cm/hr. The deposit of soot was 60 mm in diameter and 300 mm long. The soot was sintered in an oven at about 1400° C. to provide a transparent vitreous rod about 25 mm in diameter and 150 mm long. Infrared spectrum indicated that the vitreous substance contained about 1 ppm OH groups.

EXAMPLE 2

A burner comprising three coaxial cylinders and whose outside diameter was about 18 mm was supplied with $SiCl_4$ (0.1 liter/min)+$GeCl_4$(0.03 liters/min)+$O_2$ (2.5 liters/min), argon gas (1.3 liters/min) and hydrogen gas (3.5 liters/min), with $SiCl_4$+$GeCl_4$+$O_2$ being supplied through the innermost cylinder, argon gas through the intermediate cylinder and hydrogen gas through the outermost cylinder. Decomposition of the chlorides by flame oxidation formed soot which formed a deposit in the same manner as in Example 1. The soot was sintered to provide a vitreous rod which was found to contain about 1 ppm residual OH groups.

EXAMPLE 3

A burner comprising four coaxial cylinders and whose outside diameter was about 20 mm was supplied with $SiCl_4$ (0.1 liters/min)+$GeCl_4$(0.03 liters/min), hydrogen gas (3.5 liters/min), argon gas (1.3 liters/min) and oxygen gas (4 liters/min), with $SiCl_4$+$GeCl_4$ being supplied through the innermost cylinder, hydrogen gas through the cylinder first from the innermost, argon gas through the cylinder second from the innermost, and oxygen gas through the outermost cylinder. A deposit of soot was formed in the same manner as in Example 1. A vitreous rod was made from the soot, and it contained about 12 ppm of residual OH groups.

What is claimed is:

1. A process for producing a high-purity silica glass by flame oxidation using a burner comprised of coaxial cylindrical channels, comprising the steps of:

supplying silicon chlorides, hydrogen gas, oxygen gas, and inert gas;

decomposing the silicon chlorides by flame oxidation to form a soot of silica glass;

depositing the soot on a starter member; and sintering the deposited soot to provide a transparent vitreous substance;

the silicon chlorides being supplied from the innermost cylinder of the burner; the oxygen gas being supplied from a channel adjacent to the channel for supplying the silicon chlorides and the inert gas being supplied from a channel between channels of the oxygen gas and the hydrogen gas, the volume ratio of said oxygen gas to the sum of twice said chlorides plus the hydrogen gas being greater than 0.665 and less than about 20.

2. A process for producing a high-purity doped silica glass, comprising the steps of:

supplying silicon chlorides, hydrogen gas, oxygen gas and inert gas from a burner, and also supplying doping agent chlorides selected from the group consisting of $BCl_3$, $GeCl_4$, $PCl_3$, $POCl_3$, $PCl_5$;

decomposing the silicon chlorides and the doping agent chlorides by flame oxidation to form fine grains of doped silica glass;

depositing the decomposed fine grains of doped silica glass on a starting member; and sintering the deposited glass on the starting member to provide a transparent vitreous substance, wherein the burner comprises coaxial channels and the silicon chlorides along with the doping agent chlorides being supplied from the innermost cylinder of the burner; the oxygen gas being supplied from a channel adjacent to the channel for supplying the chlorides and the inert gas being supplied from a channel between channels of the oxygen gas and the hydrogen gas, the volume ratio of said oxygen gas to the sum of twice said chlorides plus the hydrogen gas being greater than 0.665 and less than about 20.

3. The process for producing a high-purity doped silica glass, as claimed in claims 1 or 2, wherein the silicon chlorides are selected from a group consisting of $SiCl_4$, $SiHCl_3$, and mixtures thereof.

* * * * *